(12) United States Patent
Celinski et al.

(10) Patent No.: US 6,542,016 B2
(45) Date of Patent: Apr. 1, 2003

(54) LEVEL SENSITIVE LATCH

(75) Inventors: Peter Celinski, Hallett Cove (AU); Derek Abbott, West Lakes Share (AU); Said Al-Sarawi, Walkeley Heights (AU)

(73) Assignee: Luminis Pty LTD (AU)

( * ) Notice: Subject to any disclaimer, the term of this patent is extended or adjusted under 35 U.S.C. 154(b) by 0 days.

(21) Appl. No.: 10/016,153

(22) Filed: Dec. 10, 2001

(65) Prior Publication Data
US 2002/0153931 A1 Oct. 24, 2002

(30) Foreign Application Priority Data
Dec. 21, 2000 (AU) .............................................. PR2230

(51) Int. Cl.[7] .............................................. H03K 3/037
(52) U.S. Cl. ........................ 327/218; 327/215; 327/219; 327/211; 327/216; 327/217
(58) Field of Search ................................ 327/197–203, 327/208, 210–219, 225

(56) References Cited
U.S. PATENT DOCUMENTS 4,251,739 A * 2/1981 Morozumi ................... 327/208
5,140,179 A * 8/1992 Takano ....................... 327/203
5,952,860 A * 9/1999 van Saders et al. .......... 327/219

* cited by examiner

Primary Examiner—Terry D. Cunningham
Assistant Examiner—Long Nguyen
(74) Attorney, Agent, or Firm—R. Neil Sudol; Coleman, Sudol, Sapone P.C.

(57) ABSTRACT

A binary digital logic level sensitive latch comprising a first inverter that provides an output ($O_1$). At least one input signal ($I_1$) and an activation signal (Clk) are provided to the first inventer both being capacitively coupled to an input of the first inverter and a switching threshold of the first inverter. The capacitance of the couplings being predetermined such that the output of the first inverter ($O_1$) is a NOR function of the inputs signals and the activation signal $O_1 = \overline{I_1 + Clk}$. A second inverter has as inputs capacitively coupled the output of the first inverter ($O_1$), the activation signal (Clk) and an inverted pervious output signal (P) to provide output ($O_2$). A switching threshold of the second inverter and the capacitance of the couplings being predetermined such that the output of the second inverter ($O_2$) takes the function of: $O_2 = \overline{(Clk \times P) + O_1}$.

9 Claims, 6 Drawing Sheets

LEVEL SENSITIVE LATCH

FIELD OF THE INVENTION

This invention relates to a level sensitive latch and circuits incorporating the same. A primary circuit element of binary digital logic circuits is a level sensitive latch. A latch is used in the implementation of registers that are commonly required in digital circuits.

BACKGROUND OF THE INVENTION

There is a trend of increasing the number of transistors upon a chip area of an integrated circuit. The more transistors for a given area the more complex and powerful a circuit may be. However, the more transistors for a given area the more heat which is typically generated. Heat must be dissipated and is a limiting characteristic on the operational speed of the circuit. Countering this is the desire to increase operation speed.

It is an object of this invention to provide a level sensitive latch to obviate or minimize at least one of the aforementioned problems, or at least provide the public with a useful choice.

SUMMARY OF INVENTION

The invention may be said to reside in a binary digital logic level sensitive latch including:

a first inverter providing an output ($O_1$) and having at least one input signal ($I_1$) and an activation signal (Clk) both being capacitively coupled to an input of the first inverter and a switching threshold of the first inverter and the capacitance of the couplings being predetermined such that the output of the first inverter ($O_1$) is a NOR function of the inputs signals and the activation signal:

$$O_1 = \overline{I_1 + Clk}$$

a second inverter providing an output ($O_2$) and having as capacitively coupled inputs the output of the first inverter ($O_1$), the activation signal (Clk) and an inverted pervious output signal (P) and a switching threshold of the second inverter and the capacitance of the couplings being predetermined such that the output of the second inverter ($O_2$) takes the function of:

$$O_2 = \overline{(Clk \times P) + O_1}.$$

BRIEF DESCRIPTION OF THE DRAWINGS

To assist in the understanding of the invention preferred embodiments will now be described with reference to the accompanying drawings.

DETAILED DESCRIPTION OF THE INVENTION

Figure 1:
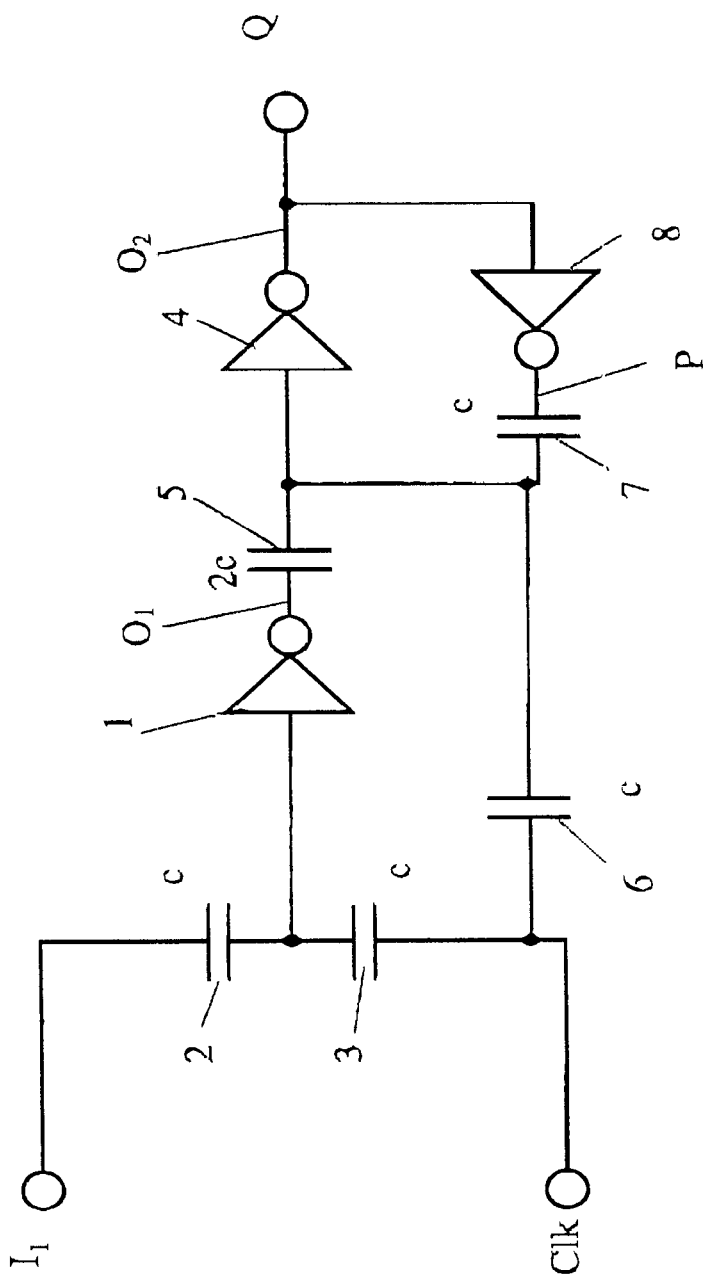
FIG. 1 is a sketch in schematic form of a level sensitive latch.

It will be appreciated that the figures are not engineering design drawings but only sketches for the purpose of assisting in explanation of the invention. Accordingly, features, perspective, proportions or the like may be inaccurate, and features may have been omitted.

It will be appreciated that herein the terms "1 state" and "0 state" refer to logic levels of a system. As such these can have voltages and polarities that are appropriate for the system.

In the case of a system where supply lines are 5 volts and 0 volts, then a 1 state may be nominally a 5 volt level and a 0 state may be nominally a 0 volt level.

It will be noted that the selection of coupling capacitances and switching thresholds enables the inverters to provide the indicated function. The overall operation of the latch may be written as:

| $I_1$ | Clk | $O_2$ |
|---|---|---|
| 0 | 0 | $I_1$ |
| 0 | 1 | P |
| 1 | 0 | $I_1$ |
| 1 | 1 | P | and so when Clk is in 0 state the latch is transparent as the output $O_2 = I_1$ the input. When the Clk is in 1 state the latch latches the pervious value of the output $O_2$.

In one form each of the coupling capacitance of the inputs to the first inverter are equal and the switching threshold of the first inverter ($T_1$) is predetermined to be:

$$T_1 = \frac{Vdd}{2n}$$

where Vdd is the nominal maximum input signal voltage, and n is the sum of the number of inputs signals and the activation signal.

For example, where there is only one input to the first inverter and then the switching threshold of the first inverter ($T_1$) is predetermined to be:

$$T_1 = \frac{Vdd}{4}.$$

The capacitive coupling of the input and the activation signal effectively acts as a capacitive voltage divider such that any one input, with equal capacitance, can impress only approximately half the voltage of a 1 state. Where Vdd is 10 volts then a 1 state may be 10 volts but the voltage impressed to upon the input of the first inverter is 5 volts and by selecting the switching threshold $T_1$ voltage to be 2.5 volts the greatest noise margin between 0 volts (a 0 state) and 5 volts (a 1 state) is provided.

It will be appreciated that where the latch is implemented in an integrated circuit then the noise as seen by the inverters is local noise and the noise margin may generally be reduced whilst still providing reliable latch operation. Accordingly, adjusting the switching threshold need not be significantly detrimental to the operation of the circuit.

According to one form, the capacitance of the coupling of the output of the first inverter ($O_1$) to the second inverter is twice the capacitance of the coupling of the activation signal (Clk) to the second inverter, and the capacitance of the coupling of the inverted pervious output signal (P) to the second inverter is equal in value to that of the capacitance of the coupling of the activation signal (Clk) to the second inverter, and the switching threshold of the second inverter ($T_2$) is predetermined to be:

$$T_2 = \frac{3Vdd}{8}$$

where Vdd is the nominal maximum input signal voltage.

In one form the latch includes a third inverter the input of which is the output ($O_2$) of the second inverter, and the output of the third inverter is inverted pervious output signal (P).

In one form, the first, second and third inverter are CMOS inverters.

The invention may also be said to reside, again not necessarily in the broadest or only form in an edge triggered register including a binary digital logic level sensitive latch as previously described wherein the latch activation signal is a clock input.

In one form the edge triggered register includes a cascade of a first level sensitive latch and a second level sensitive latch, the second level sensitive latch being sensitive to the complementary clock input of the first level sensitive latch and has an input being the output of the first level sensitive latch. According to one form the first level sensitive latch is sensitive to a clock input having a 1 state and the second level sensitive latch is sensitive to a clock input having a 0 state, and thereby the register is a negative edge triggered register. Alternatively, the second level sensitive latch is sensitive to a clock input having a 1 state and the first level sensitive latch is sensitive to a clock input having a 0 state, and thereby the register is a positive edge triggered register.

In one form the edge triggered register has the functionality of a D Register, T Register or JK Register. It will be appreciated that such registers are often incorporated into other large circuits.

Figure 6:
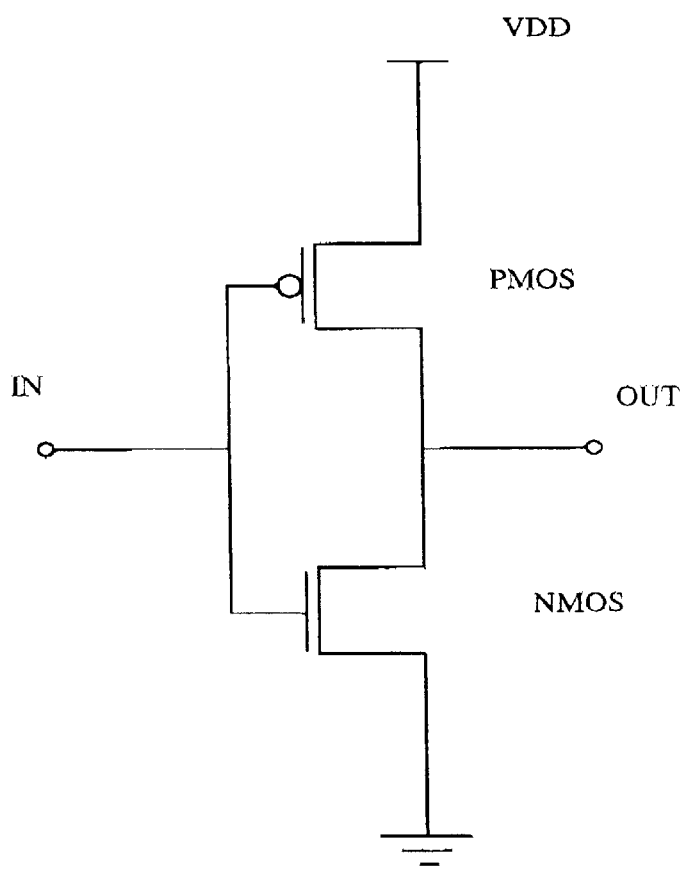
FIG. 6 is a sketch in schematic form of a CMOS inverter.

The binary digital logic level sensitive latch of FIG. 1 is intended to operate off 0 (Gnd) and 5 volts (Vdd) supply lines and uses CMOS inverters as shown in FIG. 6. The latch includes a first inverter (1) providing an output ($O_1$) and having at least one input signal ($I_1$) and an activation signal (Clk) both being capacitively coupled by capacitors (2 and 3) to an input of the first inverter.

The value of the capacitors (2 and 3) is nominally 5 fF and therefore their sum is significantly greater than the input capacitance of the inverter. Accordingly when a 1 state (5 volts) appears at one of either the activation signal (Clk) or input signal ($I_1$) the voltage impressed upon the input of the inverter is 2.5 volts, and when both the activation signal (Clk) and input signal ($I_1$) are a 1 state then 5 volts is impressed onto the input of the inverter.

A switching threshold of the first inverter is set at approximately $$T_1 = \frac{Vdd}{2n}$$

where n is the number of capacitively coupled inputs to the inverter. In this case n=2 (the activation signal (Clk) and input signal ($I_1$)) and so $$T_1 = \frac{Vdd}{4}$$

or 1.25 volts. This switching threshold is midway between both inputs (the activation signal (Clk) and input signal ($I_1$)) being both a 0 state (Gnd) and one of the inputs (the activation signal (Clk) or input signal ($I_1$)) being a 1 state (Vdd) where the input of the inverter has 2.5 volts impressed upon it. The effect of these predetermined capacitance and switching threshold is that the first inverter acts as a NOR gate $O_1 = \overline{I_1 + Clk}$.

The latch includes a second inverter (4) providing an output ($O_2$) and having as capacitively coupled inputs, through respective capacitors (5, 6 and 7) the output of the first inverter ($O_1$), the activation signal (Clk) and an inverted pervious output signal (P). Capacitor (5) is twice the capacitance of either capacitors (6 or 7) and has a valve of 10 fF whereas capacitors (6 or 7) both have a value of 5 fF.

A switching threshold ($T_2$) of the second inverter is set at approximately $$T_2 = \frac{3Vdd}{8}$$

or 1.875 volts in this case. The effect is that the second inverter has the function of $$O_2 = \overline{(Clk \times P) + O_1}.$$

A third inverter (8) is provided which inverts the output ($O_2$) of the second inverter to form the inverted pervious output signal (P).

It will be noted that the selection of coupling capacitances and switching thresholds enables the inverters to provided the operation of the latch as may be written as:

| $I_1$ | Clk | $O_2$ |
|---|---|---|
| 0 | 0 | $I_1$ |
| 0 | 1 | P |
| 1 | 0 | $I_1$ |
| 1 | 1 | P | and so when Clk is in 0 state the latch is transparent as the output $O_2 = I_1$ the input. When the Clk is in 1 state the latch latches the pervious value of the output $O_2$.

It will be understood that the values of capacitance selected is a compromise between ensuring correct circuit operation by selecting values significantly greater than the input capacitance of the inverters but preferably not so great as to either place too greater a load on outputs or to slow circuit operation too much. Selecting capacitance values so that the inverter input capacitance is 0.1 of the total capacitance seen by any inverter input allows for circuit operation.

It will also be appreciated that local noise margins within an integrated circuit generally need not be as great as for discrete circuits. Therefore, the selection of switching thresholds that provide a noise margin of, for example, 1.25 volts or less compared with 2.5 volts for similar known circuits is not seen as a great disadvantage. Obviously the number of inputs applied to the first inverter will be limited by the local noise margin but may be greater than two as illustrated here (the activation signal (Clk) or input signal ($I_1$)).

It will also be appreciated that whilst the latch may be used in a clocked system it may be used in unclocked systems or systems where a clock is not strictly periodic. What is required is that the activation signal be used to latch the input. In clocked systems the activation signal may be the clock.

Figure 2:
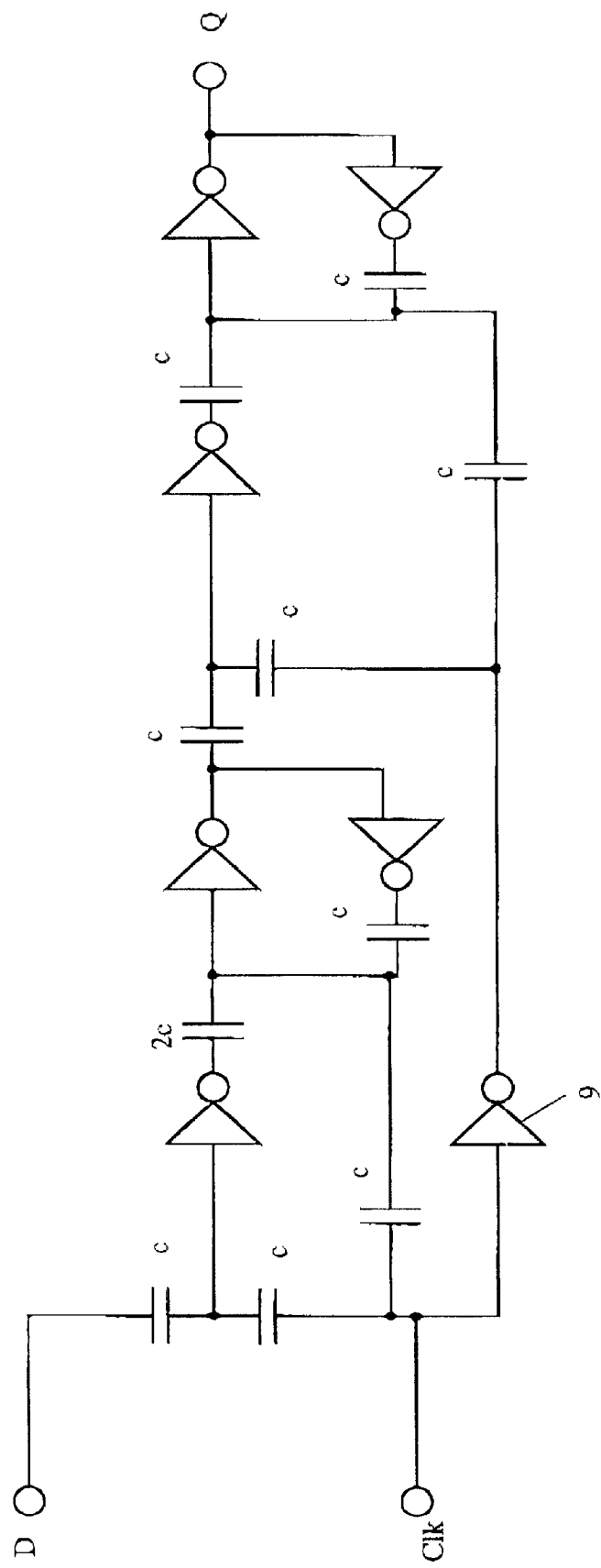
FIG. 2 is a sketch in schematic form of a D Register.

In FIG. 2 a positive edge triggered D Register is illustrated. This comprises two of the just mentioned latches in cascade. The first latch is as described above with the second differing only in that the clock input (Clk) is inverted by inverter (9). The input ($I_1$) is now a data input (D is transferred to the output (Q) of the second latch upon the positive edge of the clock input.

Figure 3:
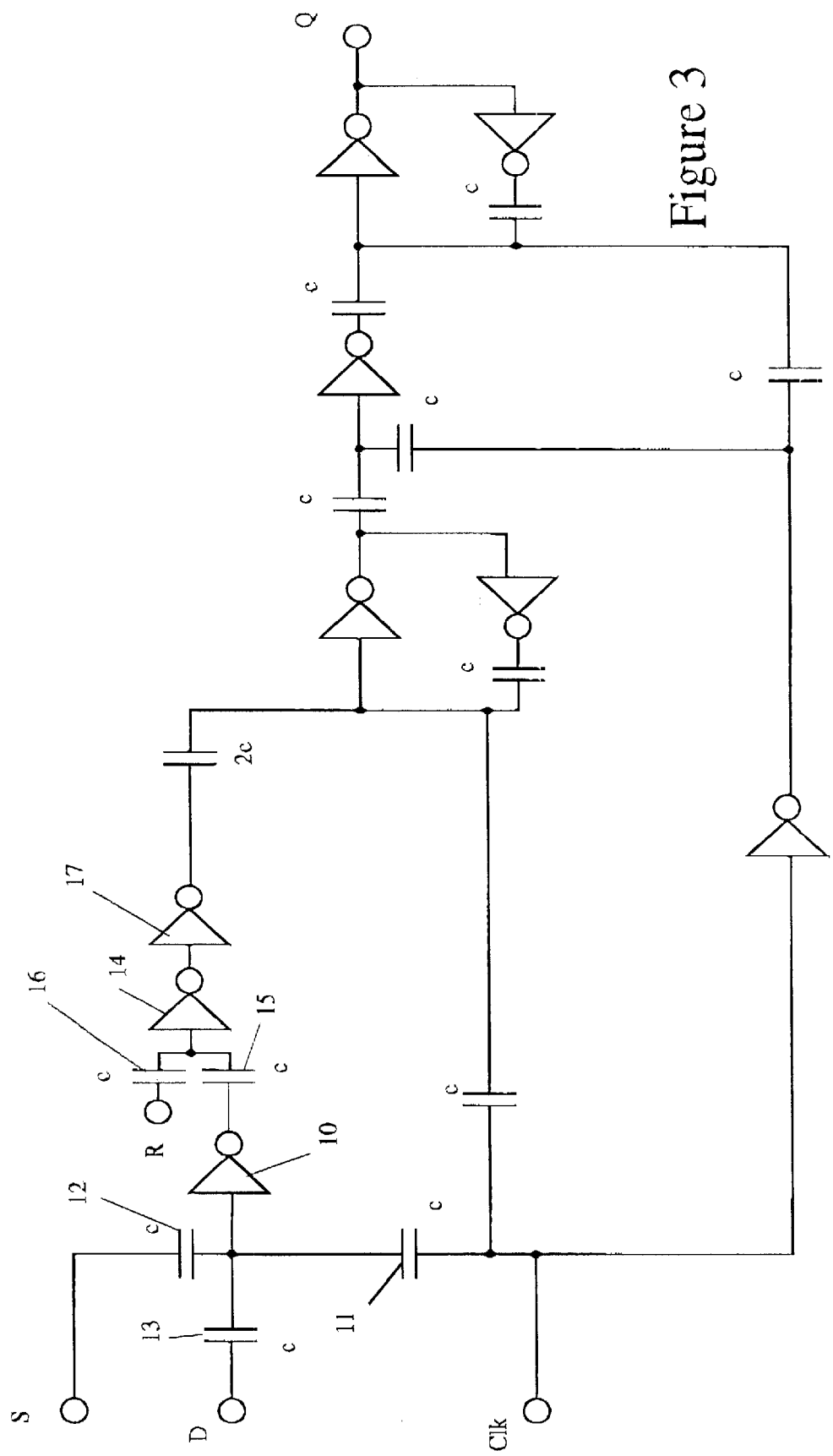
FIG. 3 is a sketch in schematic form of a D Register with set and reset control lines.

In FIG. 3 a positive edge triggered D Register is illustrated which has set (S) and reset (R) control lines. This is similar to that illustrated in FIG. 2.

Inverter (10) acts as a NOR gate for the clock (Clk), set (s) and data (D) inputs. The capacitive couplings (11, 12 and 13) for each inputs is the same and has a value of 5 fF. The switching threshold is set at one sixth Vdd. The output of inverter (10) is a 1 state only when all inputs are 0 states. Recognising this allows the reset (R) input to be effectively combined using an OR function such that a 1 state on the reset (R) input forces the remainder of the circuit to act as if the data input (D) was a 0 state irrespective of the states of set (S), clock (Clk) or data (D) inputs. To effect this, inverter (14) acts as a NOR gate for the output of inverter (10) and the reset (R) input. The coupling capacitors (15 and 16) are equal in value and are 5 fF. The switching threshold of inverter (14) is set at 1.25 volts as previously explained. Inverter (17) is provided to invert the output of inverter (14) to provide the overall OR function.

The remainder of the circuit acts as previously discussed.

The performance of these positive edge triggered D registers have been investigated and the circuit operating frequencies are comparable to the highest performance registers currently available and significantly better than conventional designs. The specific speed does however depend on the particular components of the circuit and methods of measurement. As an example using a standard technique for power dissipation comparison, 40 microwatts was dissipated at 100 MHz, and had a Data to Q delay of 2 nanoseconds.

Figure 4:
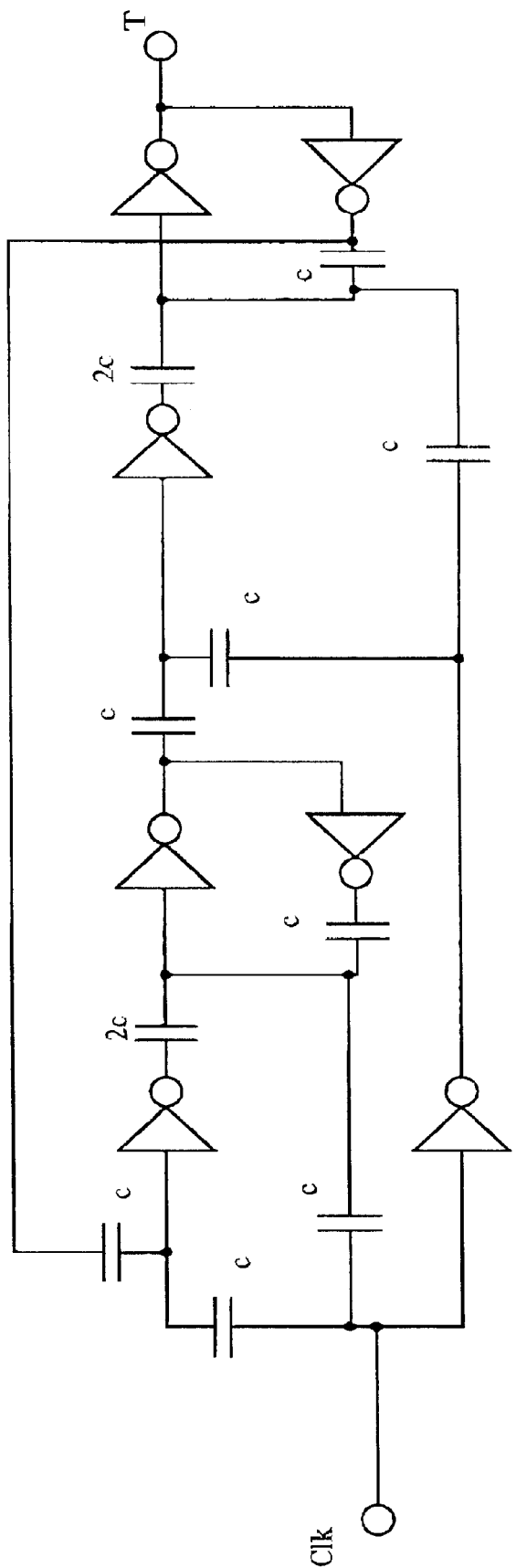
FIG. 4 is a sketch in schematic form of a T Register.

FIG. 4 illustrates a T Register. It will be noted that the previous output, being the complement of the current output, is used as a data input of what is effectively a D Register as illustrated in FIG. 2. As clock line (Clk) undergoes a positive transition the output (T) is toggled. Capacitors in this circuit have the same values as that in FIG. 2.

Figure 5:
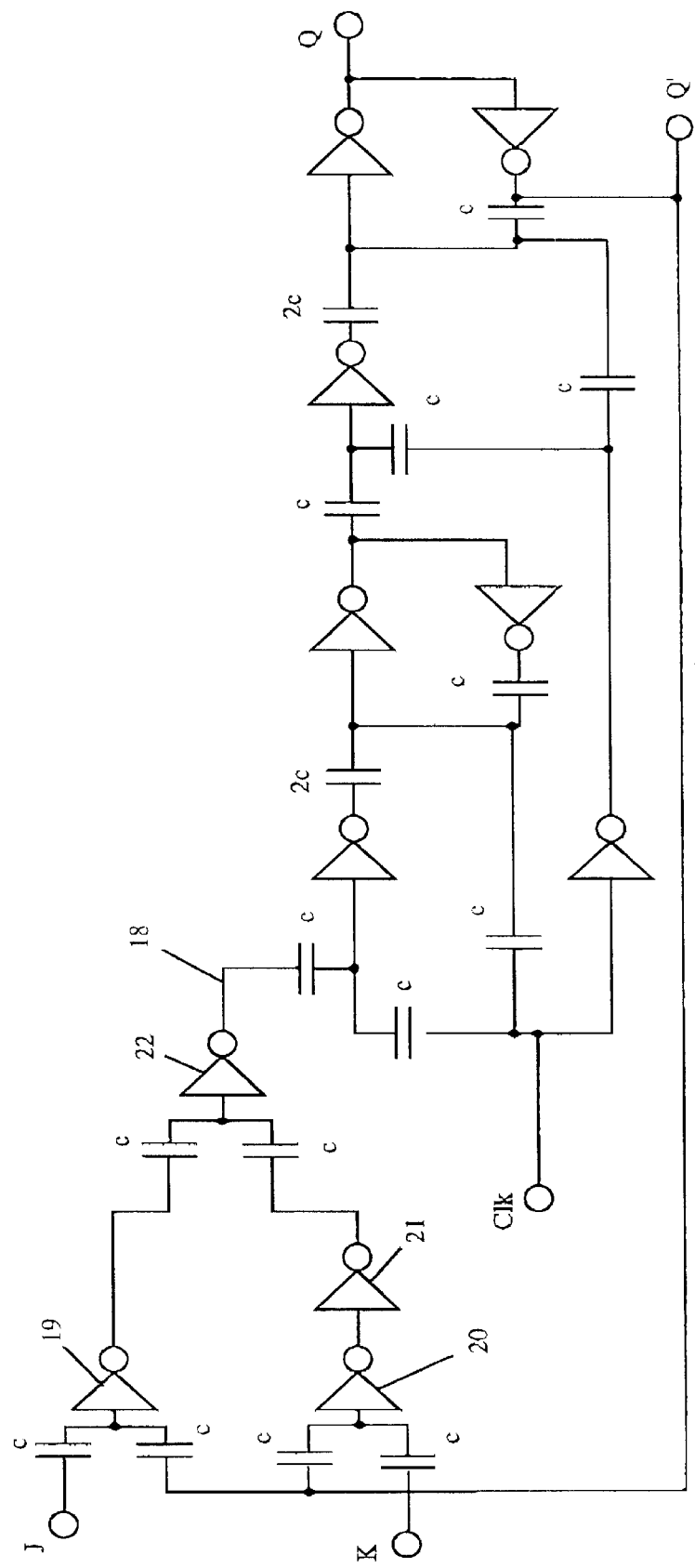
FIG. 5 is a sketch in schematic form of a JK Register.

FIG. 5 illustrates a JK Register. This is essentially a D Register of the form illustrated in FIG. 2 except that the data input (18) is a decoded form dependant on previous output value (Q'), K input (K) and J input (J) in keeping with the known functionality of a JK Register. Inverter (19) has capacitive coupled inputs (K and Q'), capacitance of the same value (c=5 fF), and effectively performs a NAND function due to the switching threshold being set at 0.75 Vdd. Inverters 20 and 21 effect an OR function of the K and Q'. The outputs of inverters (19) and (21) are inputs to inverter (22) which performs a NAND function to produce data input (18).

Although the invention has been described in terms of particular embodiments and applications, one of ordinary skill in the art, in light of this teaching, can generate additional embodiments and modifications without departing from the spirit of or exceeding the scope of the claimed invention. Accordingly, the drawings and descriptions herein are proffered to facilitate comprehension of the invention and not to limit or circumscribe the scope thereof.

What is claimed is:

1. A binary digital logic level sensitive latch including:
   a first inverter providing an output ($O_1$) and having at least one input signal ($I_1$) and an activation signal (Clk) both being capacitively coupled to an input of the first inverter and a switching threshold of the first inverter and the capacitance of the couplings being predetermined such that the output of the first inverter ($O_1$) is a NOR function of the inputs signals and the activation signal:

$$O_1 = \overline{I_1 + \text{Clk}}$$

a second inverter providing an output ($O_2$) and having as capacitively coupled inputs the output of the first inverter ($O_1$), the activation signal (Clk) and an inverted pervious output signal (P) and a switching threshold of the second inverter and the capacitance of the couplings being predetermined such that the output of the second inverter ($O_2$) takes the function of:

$$O_2 = \overline{(\text{Clk} \times P) + O_1}; \text{ and}$$

a third inverter the input of which is the output (O2) of the second inverter, and the output of the third inverter is the inverted pervious output signal (P).

2. A level sensitive latch as in claim 1 wherein each of the coupling capacitance of the inputs to the first inverter are equal and the switching threshold of the first inverter ($T_1$) is predetermined to be:

$$T_1 = \frac{Vdd}{2n}$$

where Vdd is the nominal maximum input signal voltage, and n is the sum of the number of inputs signals and the activation signal.

3. A level sensitive latch as in claim 1 wherein the capacitance of the coupling of the output of the first inverter ($O_1$) to the second inverter is twice the capacitance of the coupling of the activation signal (Clk) to the second inverter, and the capacitance of the coupling of the inverted pervious output signal (P) to the second inverter is equal in value to that of the capacitance of the coupling of the activation signal (Clk) to the second inverter, and the switching threshold of the second inverter ($T_2$) is predetermined to be:

$$T_2 = \frac{3Vdd}{8}$$

where Vdd is the nominal maximum input signal voltage.

4. A level sensitive latch as in claim 1 wherein the first, second and third inverter are CMOS inverters.

5. An edge triggered register including a binary digital logic first level sensitive latch as in claim 1 wherein the latch activation signal is a clock input.

6. An edge triggered register as in claim 5 includes a cascade of the first level sensitive latch and a second level sensitive latch, the second level sensitive latch being sensitive to the clock input of the first level sensitive latch and has an input being the output of the first level sensitive latch.

7. An edge triggered register as in claim 6 wherein the first level sensitive latch is sensitive to a clock input having a 1 state and the second level sensitive latch is sensitive to a clock input having a 0 state, and thereby the register is a negative edge triggered register.

8. An edge triggered register as in claim 6 wherein the second level sensitive latch is sensitive to a clock input having a 1 state and the first level sensitive latch is sensitive to a clock input having a 0 state, and thereby the register is a positive edge triggered register.

9. An edge triggered register as in claim 5 wherein the edge triggered register has the functionality selected from the group comprising of a D Register, a T Register and a JK Register.

* * * * *